United States Patent [19]
Nakamura et al.

[11] Patent Number: 5,543,629
[45] Date of Patent: Aug. 6, 1996

[54] SUPERLATTICE AVALANCHE PHOTODIODE (APD)

[75] Inventors: Hitoshi Nakamura, Kanagawa-ken; Shoichi Hanatani, Kodaira; Shigehisa Tanaka, Kunitachi; Tsukuru Ohtoshi, Kokubunji; Koji Ishida, Musashino; Yausunobu Matsuoka, Hachioji, all of Japan

[73] Assignee: Hitachi, Ltd., Tokyo, Japan

[21] Appl. No.: 391,287

[22] Filed: Feb. 21, 1995

Related U.S. Application Data

[63] Continuation of Ser. No. 39,681, Mar. 8, 1993, abandoned, which is a continuation of Ser. No. 679,946, Apr. 3, 1991, abandoned.

[30] Foreign Application Priority Data

Apr. 6, 1990 [JP] Japan .................. 2-090321

[51] Int. Cl.⁶ .................. H01L 29/15; H01L 31/107
[52] U.S. Cl. .................. 257/21; 257/186
[58] Field of Search .................. 357/4, 16, 30; 257/186, 21

[56] References Cited

U.S. PATENT DOCUMENTS

| | | | |
|---|---|---|---|
| 4,596,070 | 6/1986 | Bayraktaroglu | 257/604 |
| 4,645,688 | 2/1987 | Makino et al. | 257/792 |
| 4,894,526 | 1/1990 | Bethea et al. | 357/30 |
| 4,982,255 | 1/1991 | Tomito | 357/30 |

OTHER PUBLICATIONS

Capasso et al *Appl. Phys Lett.* 48 (19) 12 May 1986 pp. 1294–1296 "New Avalanche . . . Discontinuity".

Capasso et al. *Appl Phys. Lett.* 45 (11) 1 Dec. 1984 pp. 1193–1195 "Pseudo–Quaternary . . . Photodiode".

IEEE Transactions on Electron Devices, vol. ED–33, No. 10, Oct., 1986, pp. 1402–1510 "Theoretical Study of Multiquantum Well Avalanche Photodiodes made from the GaInAs/AlInAs Material System" by Kevin Brennan.

*Primary Examiner*—Jerome Jackson, Jr.
*Attorney, Agent, or Firm*—Kenyon & Kenyon

[57] ABSTRACT

A superlattice APD includes light absorption layer for generating carriers by absorbing light, a multiplication layer for multiplying the carriers, and a pair of electrodes for driving the carriers. The multiplication layer includes a superlattice structure with a well layer less than 10 nm in thickness and a barrier layer more than 10 nm and less than 20 nm in thickness deposited in alternate layers.

24 Claims, 7 Drawing Sheets

APPLIED VOLTAGE (V)

APPLIED VOLTAGE (V)

SUPERLATTICE AVALANCHE PHOTODIODE (APD)

This application is a continuation of U.S. patent application Ser. No. 08/039,681 filed on Mar. 8, 1993 and abandoned, which is a continuation of U.S. patent application Ser. No. 07/679,946 filed on Apr. 3, 1991 and abandoned.

BACKGROUND OF THE INVENTION

The present invention relates to an avalanche photodiode (APD) used for optical communication, or more in particular, to a high-speed, high-sensitivity superlattice avalanche photodiode.

If an APD is to be increased in speed and decreased in noise, it is necessary to greatly differentiate the ionization rate for electrons and holes from each other. One structure known for improving the ionization rate in this way is a superlattice APD. In the prior art, an effective well width within a multiplication area of a superlattice APD has been considered to be in a comparatively wide range (say, from 20 to 50 nm) where the quantum effect is not significantly exhibited. (See, for exmaple, IEEE, Trans. on Electron Devices, ED-33, No. 10 (1986), pp 1502–1510.) This is by reason of two facts, one that the ionization rate threshold energy is increased by the quantum effect, and the other that the band discontinuity value is decreased.

SUMMARY OF THE INVENTION

The prior art described above, which sufficiently improves the ionization rate ratio, is capable of increasing the speed based on the shortened rise time of multiplication and decreasing the noises caused in the multiplication process. Nevertheless, the following several problems are posed in applying this structure to a very high-speed APD of about 10 Gb/s:

1. Lower gain;
2. Decreased ionization rate ratio;
3. Increased dark current;
4. Increased noises;

The present invention provides a structure of superlattice APD solving the problems 1 to 4.

The present invention realizes a high-speed APD by adding several other conditions of structure required for increasing the speed.

The cause of the above-mentioned problems will be explained. For realization of a high-speed operation at 10 Gb/s, the mere shortening of the rise time of multiplication by improving the ionization rate ratio is not sufficient, but a shortened running time of carriers is indispensable. This in turn makes it necessary to reduce the film thickness of a light absorption layer and a multiplication layer as compared with the conventional APD having an operation speed of 0.4 to 2 Gb/s. The InGaAs/InAlAs superlattice used for 10 Gb/s optical communication requires a light absorption layer of 1.0 µm or less and a superlattice multiplication layer of 0.5 µm or less, or at least 0.7 µm or less. With the decrease in the thickness of the multiplication layer, an increased electric field is required to obtain a gain. Thus, the problems described above are posed by the conventional devices having a well width of 20 to 50 nm.

According to the present invention, these problems are solved by reducing the width of the well layer to less than 10 nm and the width of the barrier layer to less than 20 nm.

Further, to prevent the pile-up of carriers posing the problem in high-speed operation, a structure for reducing or removing the potential barrier is introduced into the problem heterointerface. Also, for the purpose of increasing the gain, it is necessary to increase the number of heterointerfaces in the superlattice multiplication layer, that is, the number of well layers. It is important to secure more than 30 such interfaces as explained in detail below.

Furthermore, effective methods of fabricating a device include molecular beam epitaxy, organic metal gas phase growth or a combination organic metal-molecular beam epitaxy which is capable of producing a thin film with high controllability.

The functions of the present invention as related to the four problems of the prior art described above will be explained below itemwise.

1. Gain:

When the applied electric field is constant, the gain of the superlattice APD is determined mainly by (1) the periodicity of the superlattice (heterostructure) and (2) the well width. Assume that the total thickness of the superlattice multiplication layer is 0.5 µm, and the well width and the barrier layer width $L_w$ and $L_b$ respectively. In the prior art, the period N=5 when $L_w=L_b=50$ nm, while N=38 when $L_w=5$ and $L_b=8$ nm according to the present invention. As a result, the decreased ionization rate with the decrease in $L_w$ is compensated for, thereby making it possible to secure a large gain.

2. Ionization rate ratio:

For the reasons mentioned above, it is possible, according to the present invention, to reduce the electric field as compared with the prior art in order to secure the same gain. The ionization rate ratio decreases with the increase in the electric field, and therefore a large ionization rate ratio is capable of being obtained according to the present invention.

3. Dark current:

The main dark current component of the superlattice APD is a tunnel current between well layers. According to the present invention, the decreased $L_w$ reduces the tunnel current by the two effects including (1) a reduced tunnel probability with the increase in the effective barrier height and width, and (2) a reduced tunnel probability due to a decreased operating electric field.

4. Noises:

One of the known causes of an increased noise in the multiplication process is a mixed injection. This is a condition for injection in which carriers including both electrons and holes are injected into the multiplication layer to make a seed for multiplication. The mixed injection in the superlattice APD is caused by the light being absorbed into the superlattice multiplication layer. The InGaAs/InAlAs superlattice for optical communication has an absorption coefficient of the InGaAs well layer as large as about 8000 $cm^{-1}$ for the wavelength of 1.55 µm. According to the present invention, in which $L_w$ is narrow, the absorption coefficient is capable of being reduced to about 100 to 4000 $cm^{-1}$ by the quantum effect. As a result, it is possible to suppress the mixed injection components.

Also, a high-speed APD is made possible by combining the present invention described above with the pile-up prevention structure known in the prior art.

DETAILED DESCRIPTION

An embodiment of the present invention will be explained below. In order to study the effect of improvement on the four problems mentioned above (i.e., gain, ionization rate ratio, dark current and noises) according to the present invention, four types of superlattice APD having a basic structure shown in FIG. 1 were test fabricated. An n-InAlAs layer 14 ($n=1\times10^{19}$ cm$^{-3}$, d=1 µm), an undoped InGaAs/InAlAs superlattice multiplication layer 13 and a p-InAlAs layer ($p=2\times10^{18}$ cm$^{-3}$, d=1 µm) are layered on an n-InP substrate 15. Numerals 11 and 16 designate p and n electrodes respectively. APDs having four types of superlattice structure of Lw=50, 30, 10 and 5 nm were test fabricated under the conditions that the total thickness of the superlattice multiplication layer 13 is 0.7 µm, the total of the well layer width Lw is 0.3 µm and the total of the barrier layer width Lb is 0.4 µm. These four types of device are described below as a, b, c and d respectively.

A device is fabricated in the manner that will be mentioned. The molecular beam epitaxy was used for crystal growth. The growth temperature was at 500° C. and the As pressure at $2\times10^5$ Torr. The wet etching with Br$_2$:HBr:H$_2$O= 1:17:64 was used for mesa etching. The surface was passivated with a SiN film by the plasma CVD process.

Figure 2:
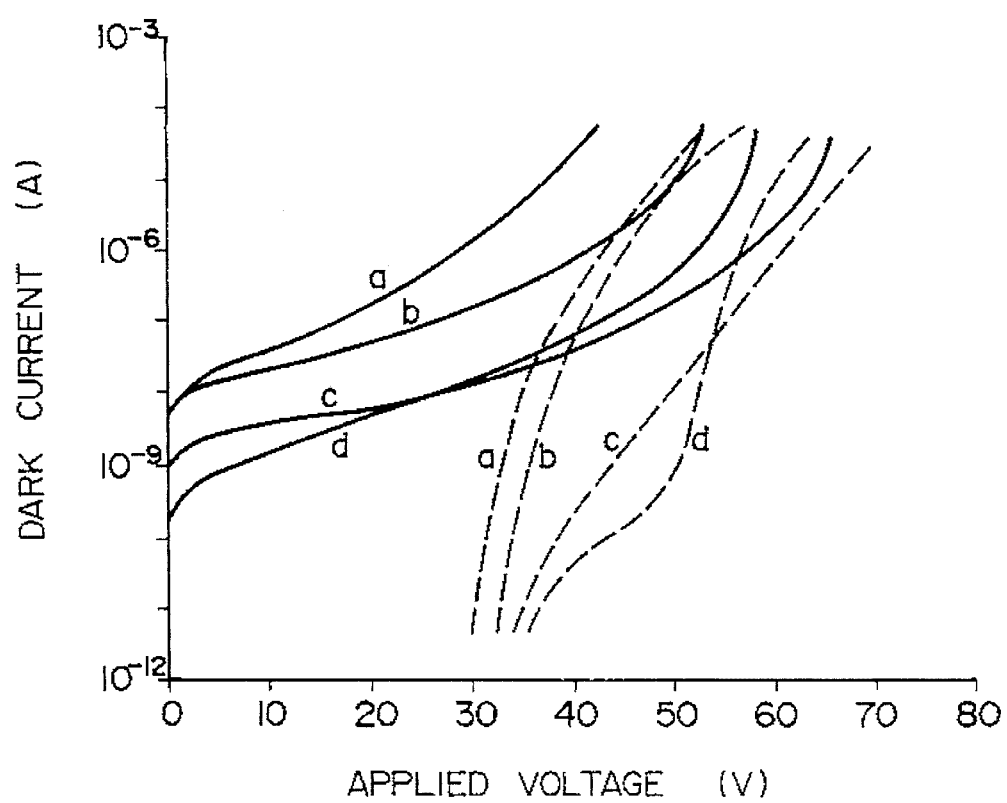
FIG. 2 is a diagram for explaining the current-voltage characteristic of the device shown in FIG. 1.

The dark current characteristics of a–d are shown by solid lines in FIG. 2. The calculated values of the tunnel current are shown by dashed lines in the same diagram. It will be seen that when Lw is 10 nm or more, the tunnel current sharply increases. This is due to the fact that the tunnel current is generated within a single well layer.

Figure 3:
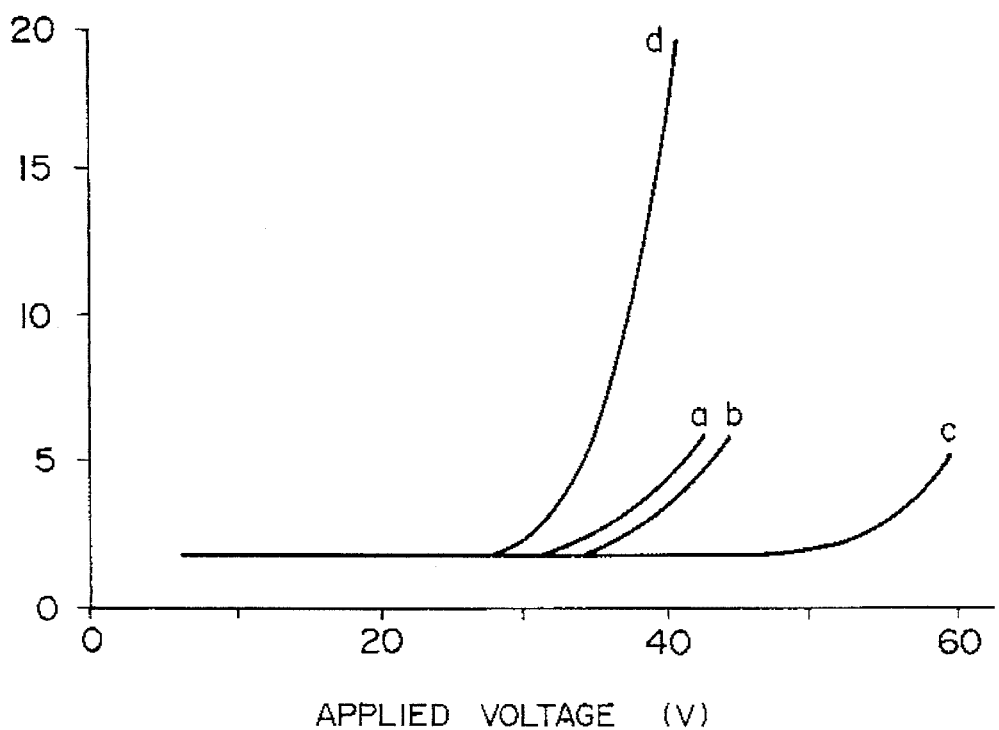
FIG. 3 is a diagram showing the multiplication characteristic of the device shown in FIG. 1.

The multiplication characteristic is shown in FIG. 3. The incident wavelength is 0.64 µm and the incident input is 0.1 µw, providing substantially complete conditions for electron injection. The multiplication was caused in the device d at the lowest voltage. This is probably because of the difference in the number of well layers mentioned above. Now, the ionization rate ratio (α/β) determined by noise measurement is shown in Table 1.

TABLE 1

| Device | Lw (nm) | Ionization rate ratio (α/β) |
|---|---|---|
| a | 50 | 0.02–0.05 |
| b | 30 | 0.2 |
| c | 10 | |
| d | 5 | 20–40 |

The ionization rate ratio (α/β) being smaller than 1 for the devices a and b appears to be due to the fact that a multiplication mechanism different from that of the normal superlattice APD was generated, although no details are known. The considerable gap between the values corresponds to the dependency of the applied voltage.

Figure 4:
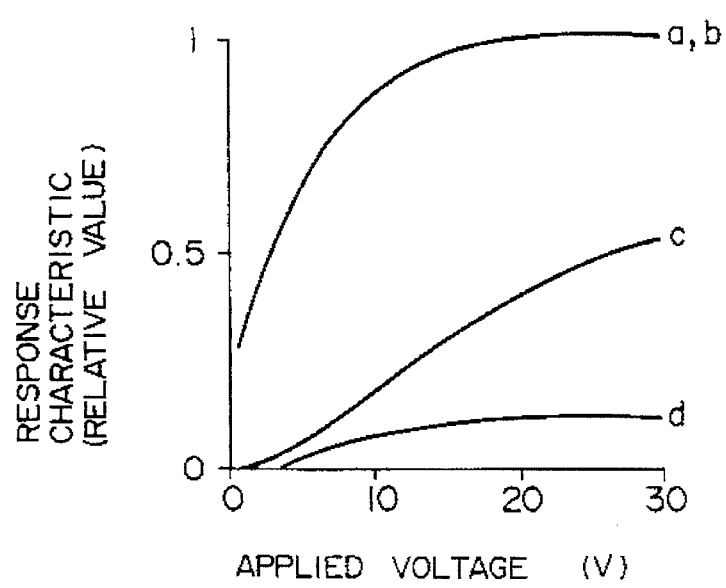
FIG. 4 is a diagram showing the photo response (relative value) of the device shown in FIG. 1.

The photo response characteristics (the value of optical current less the dark current) for the wavelength of 1.55 µm and the incident input of 0.1 µw of the devices a–d are shown in FIG. 4. Relative values standardized on the basis of 30 V for the device a are shown in the diagram. This wavelength is mainly used for optical communication, at which the sensitivity is very low for the device d of Lw=5 nm. This indicates that the narrow well width caused the effective band gap to be increased due to the quantum effect and that this device is capable of preventing the mixed injection described above in "4. Noises" in the section relating to the functions.

The aforementioned basic experiment indicates that the device d of Lw=5 nm is capable of solving the four problems as the objects of the present invention. Specifically, a device having a superlattice multiplication layer 0.7 µm thick, a well layer thickness Lw of 5 nm, a barrier layer thickness Lb of 6.6 nm and well layers in the number (the number of barriers for selectively accelerating electrons in the superlattice APD) of 60, is capable of producing (1) a maximum gain of 20, (2) an ionization rate ratio of 20 to 40, (3) a dark current of less than 30 nA (for the gain of unity), and (4) the ratio of mixed injection of 1/20 (ratio between 30 and 50 nm in Lw).

Figure 5:
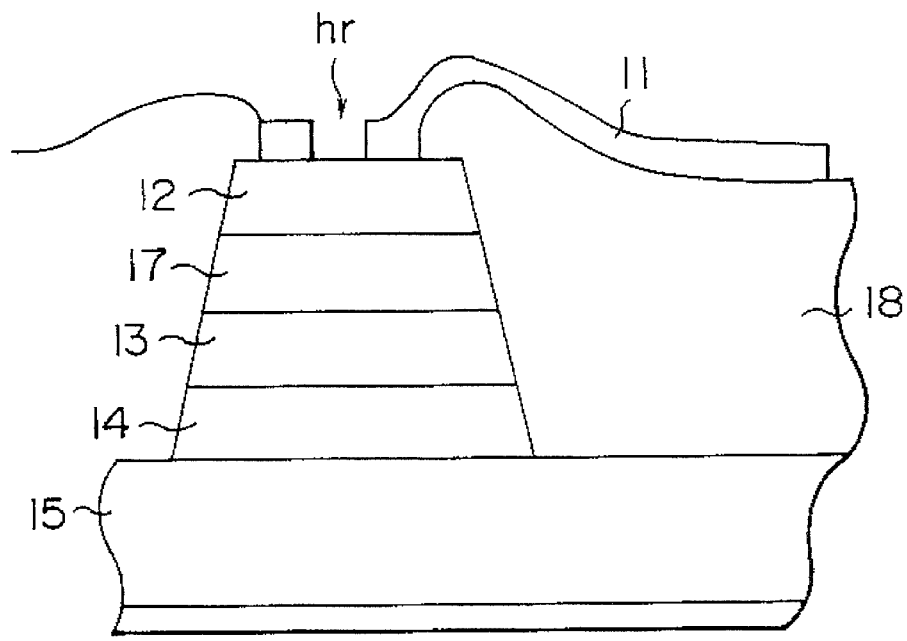
FIGS. 5 and 6 are diagrams showing sectional structures of other embodiments of the present invention.
Figure 6:
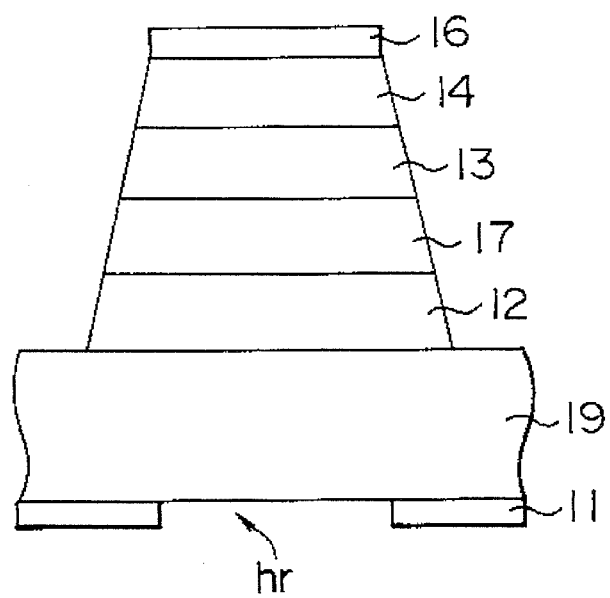

Now, explanation will be made about the superlattice APD for 10 Gb/s fabricated according to the study described above. Two structures shown in FIGS. 5 and 6 were fabricated. FIG. 5 shows a front surface incidence type, and FIG. 6 a back surface incidence type, which are basically different from the type shown in FIG. 1 in that in the devices shown in FIGS. 5 and 6, the film thickness of the superlattice multiplication layer is 0.5 µm, an InGaAlAs graded layer is introduced in the side causing an electron pile-up in the superlattice for preventing the carrier pile-up, an InGaAs light absorption layer 17 (1.0 µm thick with $Na=2\times10^{15}$ cm$^{-3}$) is introduced, the device of FIG. 5 is embedded in a PIQ layer 18 for reducing the capacity with a pad for n-electrode deposited thereon, and the device of FIG. 6 using a p-InP substrate 19 has layers reversely deposited to the devices of FIGS. 1 and 5. In FIGS. 5 and 6, the same reference numerals as those in FIG. 1 designate component parts identical to the corresponding layers in FIG. 1 respectively.

Figure 1:
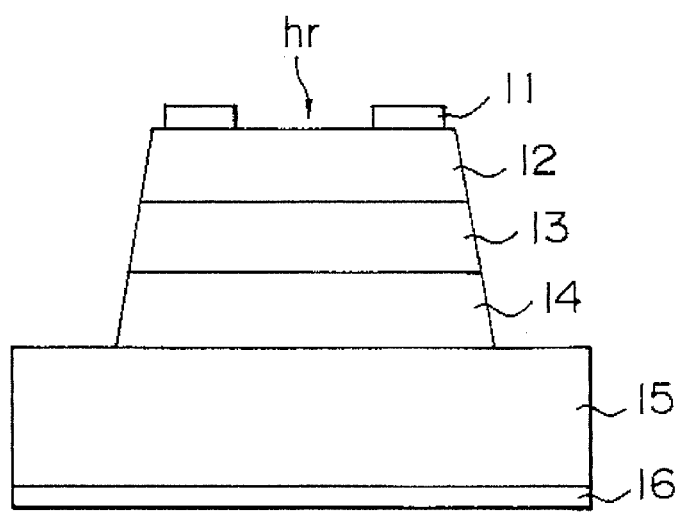
FIG. 1 is a sectional view showing a basic configuration of the present invention.

The method of fabrication employed is basically the same as that for FIG. 1. In FIG. 5, the assembly is subjected to baking at 350° C. in N$_2$ for hardening the PIQ layer to embed the device in the PIQ layer, and the reactive ion etching (etching gas O$_2$, vacuum degree 1mTorr, and RF output 200 W) is used for patterning.

Figure 7:
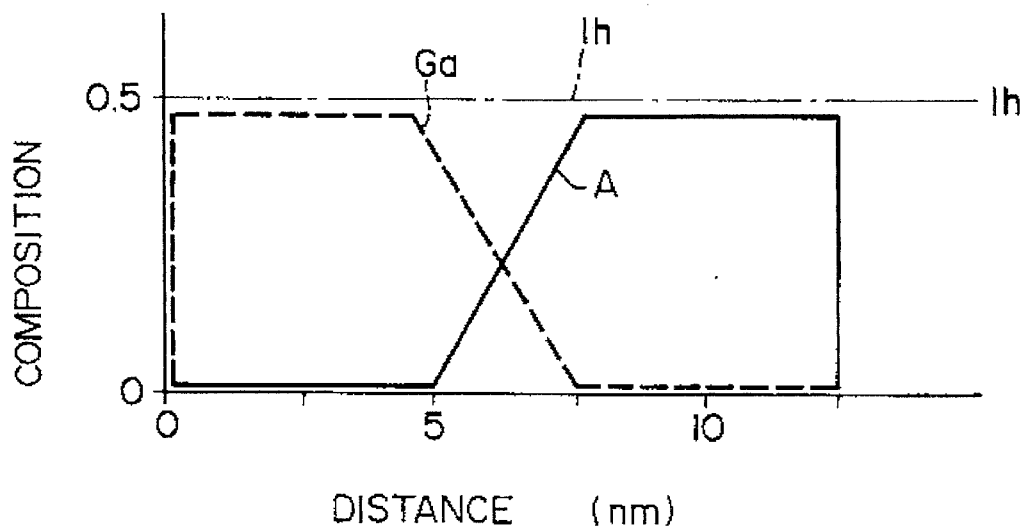
FIG. 7 is a diagram showing an example of composition (design) of one period of a superlattice multiplication layer of the superlattice APD shown in FIGS. 5 and 6.

The superlattice multiplication layer of the APDs shown in FIGS. 5 and 6 will be described in detail. The total film thickness is 0.5 µm. The design structure for a period is shown in FIG. 7. The range from 0 to 5 nm represents the InGaAs well layer, the range from 5 to 7.5 nm the InGaAlAs graded layer (pile-up prevention layer) with a changing composition, and the range from 7.5 to 12.5 nm the InAlAs barrier layer, with a period of 12.5 nm and the periodicity (number of well layers) of 40. A similar graded layer is also interposed between the layers 13 and 17.

The junction diameter of the devices for both cases is 30 μmφ, the capacity under the operating voltage is 0.25 pF and 0.20 pF respectively for the structures shown in FIGS. 5 and 6.

The device characteristics measured are shown in Table 2.

The frequency and the ionization rate ratio are measured by the heterodyne method and the noise measurement respectively.

TABLE 2

| | Max cut-off frequency fc (corresponding multiplication rate M) | Quantum effect | Dark current (M = 1) | Ionization rate ratio K |
|---|---|---|---|---|
| Structure of FIG. 5 | 11 GHz (10) | 60% | 20 nA | 18 |
| Structure of FIG. 6 | 12 GHz (10) | 60% | 80 nA | 17 |

Although the present embodiment uses an InGaAlAs graded layer as a structure for preventing the pile-up, the pseudo-mixed crystal process and the miniband transport process with an InGaAs/InAlAs ultra-thin film are also effective.

Now, another embodiment will be described.

Figure 8:
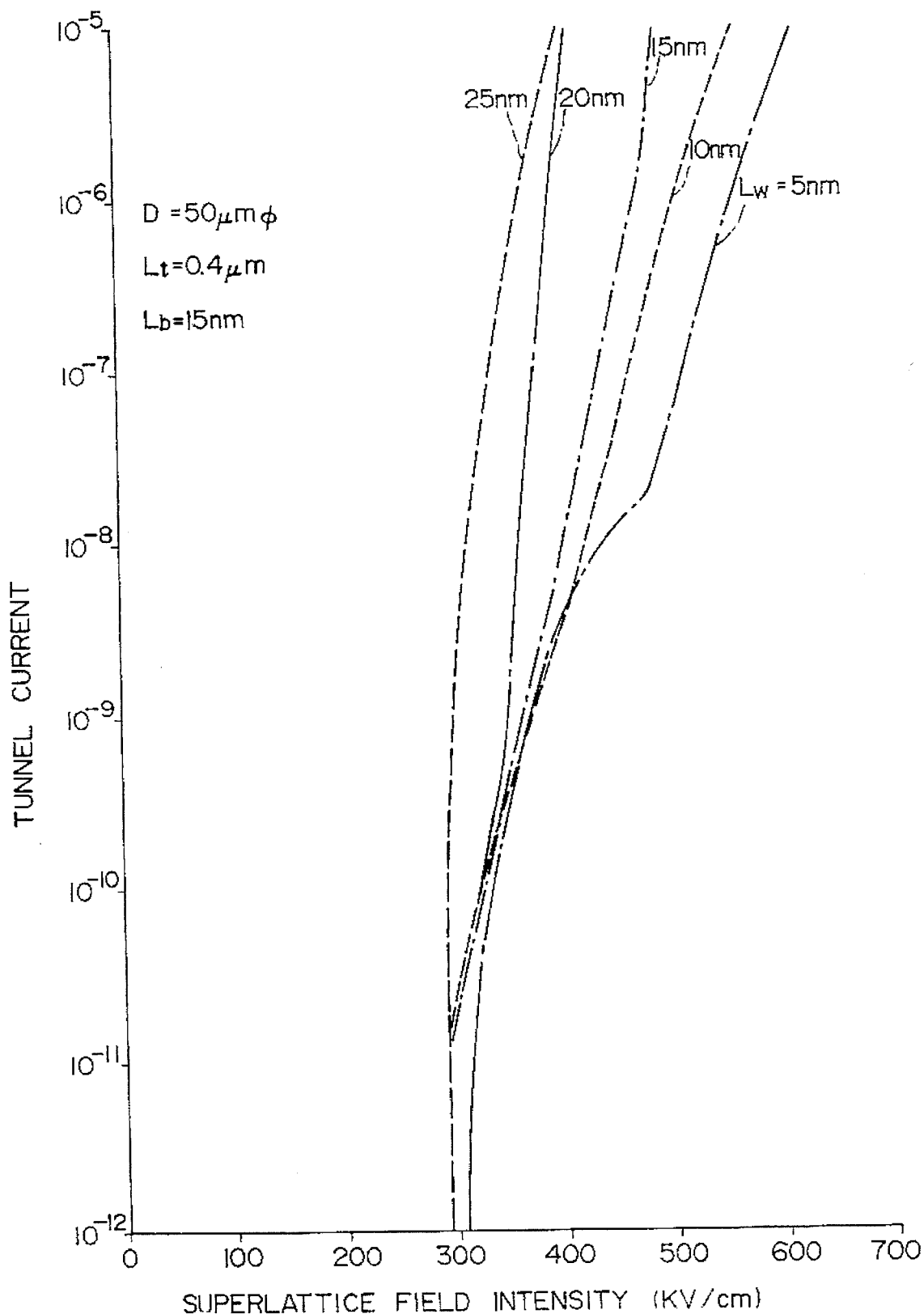
FIG. 8 is a diagram showing the interband tunnel current and the electric field applied to the superlattice structure as a parameter.
Figure 9:
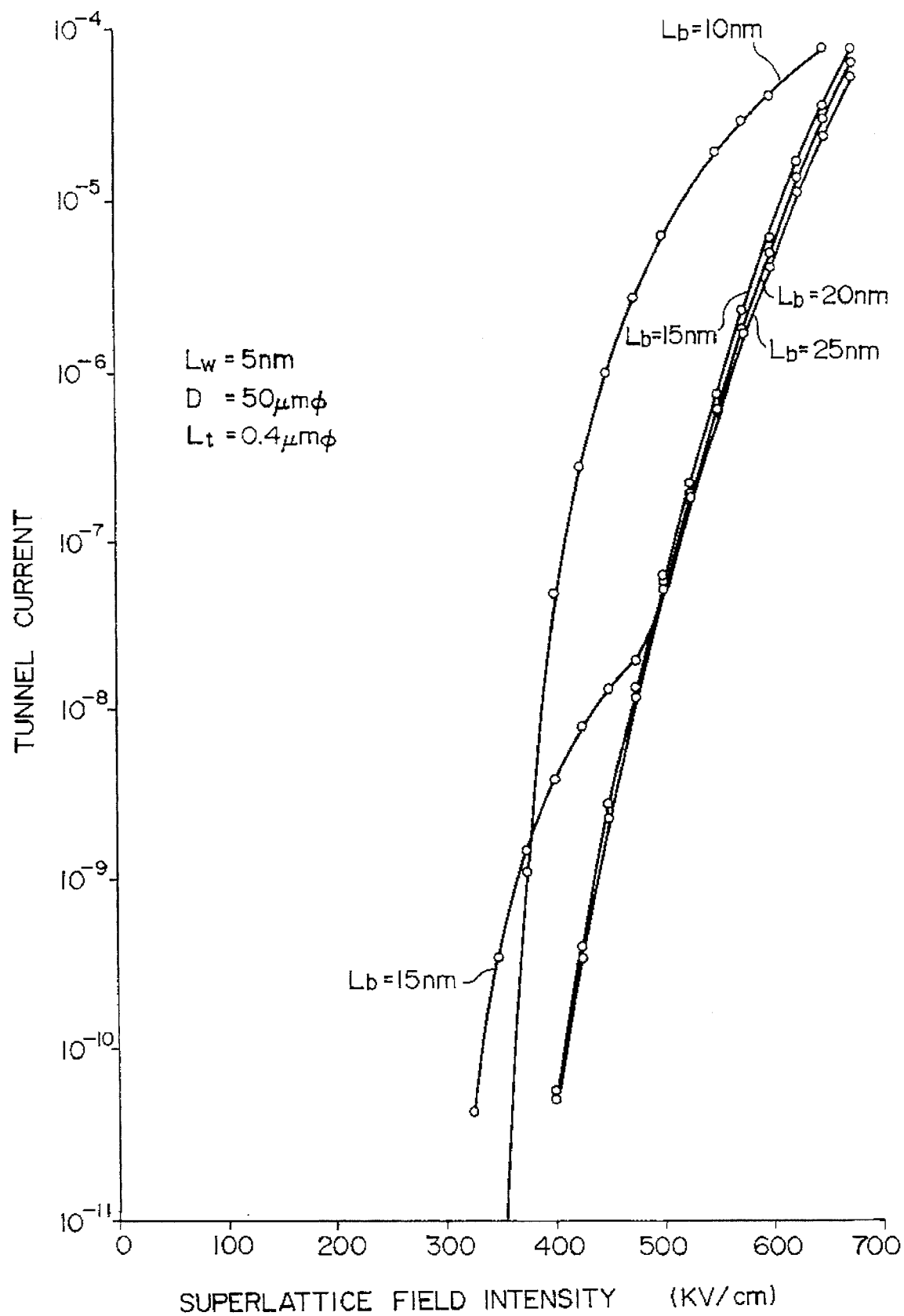
FIG. 9 is a diagram showing the interband tunnel current and the electric field applied to the superlattice multiplication layer with the superlattice structure as a parameter.

First, a mechanism is shown for suppressing the dark current by a superlattice structure according to the present invention. The tunnel current between bands is controlling as a current flowing in the superlattice multiplication layer in a high electric field which causes a multiplication. FIG. 8 shows the calculated values of the tunnel current between bands and the electric field E (SL) applied to the superlattice multiplication layer with a superlattice structure as a parameter. The superlattice structure with Lb of 15 nm. (constant) has Lw of 5, 10, 15 and 20 nm, Lt of 0.5 μm and the junction diameter of 50 μm. From this diagram, it is seen that the tunnel current between bands of the superlattice multiplication layer has a very large dependency on Lw and that the tunnel current is capable of being suppressed to less than 100 nA for up to a very high electric field of E (SL)=500 kV (where the multiplication of about 10 is caused with the superlattice structure according to the present invention). Also, the result of a similar calculation is shown in FIG. 9 for Lb of 5, 10, 15 and 20 nm with Lw of 5 nm (constant). The values of Lb less than 10 nm and Lw larger than 10 nm are effective for suppressing the tunnel current. By increasing Lb beyond 15 nm, in particular, it is seen that a conspicuous effect of suppressing the tunnel current is produced.

Explanation will be made about the relationship between the superlattice structure and the ionization rate ratio according to the present invention. Apart from the detailed data described below, an ionization rate ratio as high as about 10 is capable of being secured according to the present invention. A high ionization rate ratio in a superlattice APD is normally caused by the difference in band discontinuity value between the valence electron band and the conduction band. According to the present invention, the difference in spatial distribution of impact ionization between electrons and holes, in addition to the difference in band discontinuity value, is considered to have caused a large ionization rate ratio.

Figure 10:
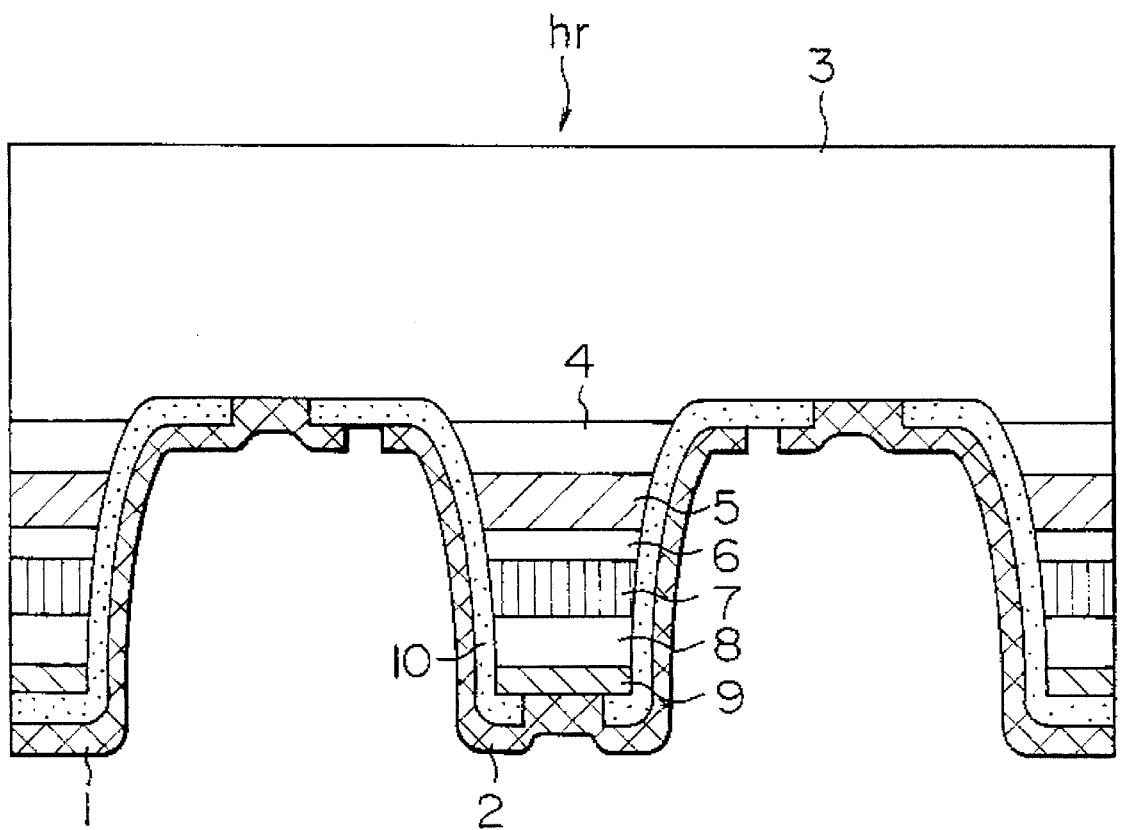
FIG. 10 is a diagram showing a section view of a superlattice APD according to the present invention.

A sectional view of a superlattice APD according to the present invention is shown in FIG. 10. This device is an APD of a mesa back surface incidence type with a light absorption layer 7 and a multiplication layer isolated from each other, the multiplication layer having a superlattice structure 5. The superlattice multiplication layer making up a feature of the present invention a width Lw of an InGaAs well layer of 5 nm and an InAlAs barrier layer width Lb of 15 nm with the total thickness of the superlattice multiplication layer of 0.35 μm.

In FIG. 10, numeral 1 designates an n-type electrode, numeral 2 a p-type electrode, numeral 3 an n-InP substrate (thickness d of 150 μm and the carrier concentration N of $2\times10^{18}/cm^3$), numeral 4 an n-InAlAs buffer layer (d=1 μm, $N=2\times10^{18}/cm^3$), numeral 5 an undoped superlattice multiplication layer (d=0.5 μm, $N<1\times10^{-15}/cm^3$), numeral 6 a p-InAlAs field relaxation layer (d=0.2 μm, $P=1.3\times10^{17}/cm^3$), numeral 7 a p-InGaAs light absorption layer (d=1.7 μm, $P=2\times10^{15}/cm^3$), numeral 8 a p-InAlAs buffer layer (d=1 μm, $P=2\times10^{18}/cm^3$), and numeral 9 a p-InGaAs contact layer (d=0.2 μm, $P=2\times10^{19}/cm^3$), and numeral 10 a polyimide passivation film. The junction diameter is 50 μm.

Molecular beam epitaxy is used for crystal growth according to the present invention, and wet etching with a Br solution is used to form a mesa configuration. The Au/Pt/Ti formed by vacuum evaporation is used for both p and n types of electrodes.

The characteristics of this device will be described. The dark current, device capacity and the ionization rate ratio for the multiplication factor M of 10 were 800 nA, 0.13 pF and 10 respectively. The quantum effect for the incident light wavelength of 1.55 μm was 85%. The evaluation of the frequency characteristics of this device by spectral analyzer shows the cut-off frequency of 10 GHz at the multiplication factor of 10 and the gain-bandwidth product of 105 GHz.

The receiving sensitivity was determined from a transmission test using this device. A DFB laser of an oscillation wavelength of 1.55 μm was used as a light source, and the minimum sensitivity of −28 dBm was obtained for the optic fiber length of 100 km and the bit error rate/$10^{11}$.

As explained above, the present invention relates to a superlattice structure of a superlattice APD and is not obviously limited to the device structure (specifications and the like of the layers other than mesa type, back surface incidence type and superlattice multiplication layer) shown in the present embodiment.

Figure 11:
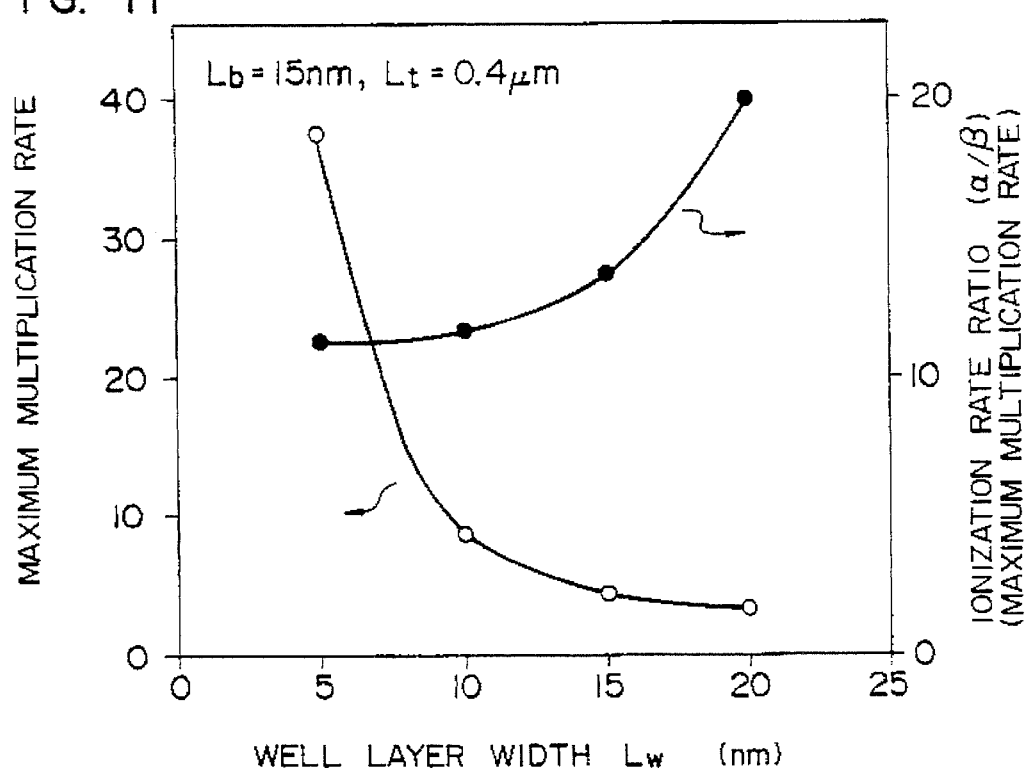
FIG. 11 is a diagram showing the dependency of the maximum multiplication factor and, the ionization rate ratio on the superlattice structure for Lb=15 nm.
Figure 12:
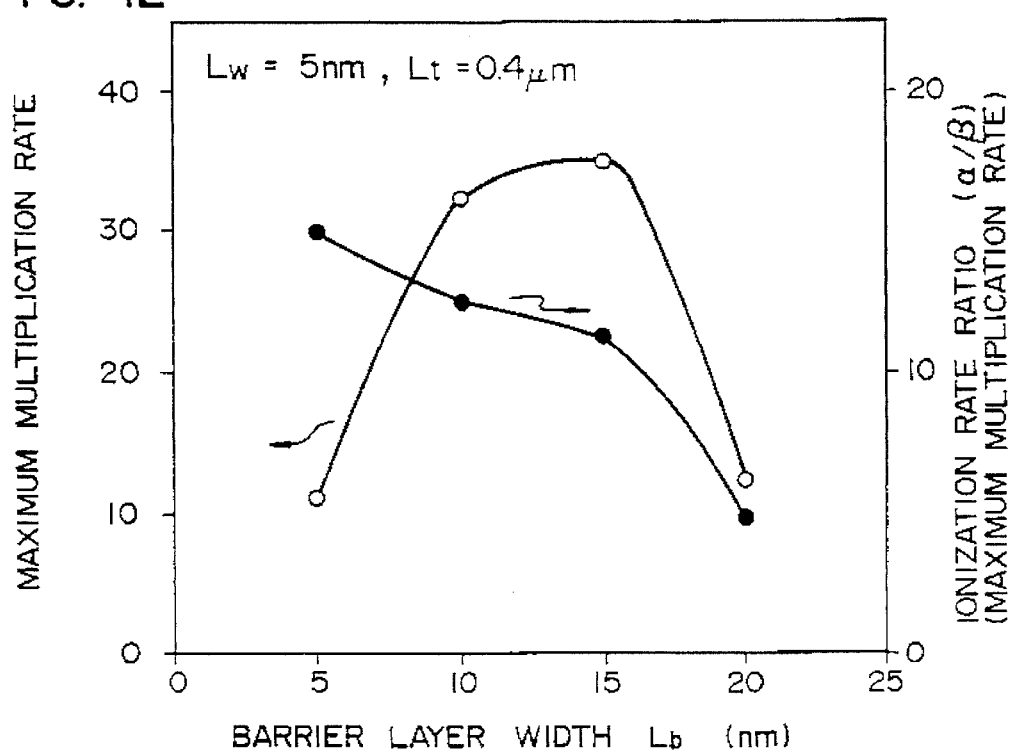
FIG. 12 is a diagram showing the dependency of the maximum multiplication factor and the ionization rate ratio on the superlattice structure for Lb=5 nm.

Also, the reason for limiting the specifications of the superlattice multiplication layer according to the present invention was shown in FIGS. 8 and 9 from the viewpoint of dark current. Now, the result of an experiment conducted from the viewpoint of the multiplication factor and the ionization rate ratio will be described. FIGS. 11 and 12 show the dependency of the maximum multiplication factor and the ionization rate ratio on the superlattice structure. FIG. 11 represents a case where Lb=15nm (constant), Lw=5, 10, 15 and 20 nm, Lt=0.4 μm, and FIG. 12 a case where Lw=5 nm (constant), Lb=10, 15, 20 and 25 nm, and Lt=0.4 μm. The device structure and the method of fabricating the device are similar to those of the embodiment described above. The main factor of determining the maximum multiplication factor in FIGS. 11 and 12 is considered the tunnel breakdown caused by the increase in the tunnel current, and so FIGS. 8 and 9 are correlated to each other. The difference in ionization rate ratio (for the maximum multiplication rate) between the two diagrams is considered to be based on the difference in electric field due to the difference in thickness of the InGaAs well layer. When considering FIGS. 8 and 9 as well as FIGS. 11 and 12, it will be seen that the superlattice structure according to the present invention in which Lw is smaller than 10 nm and Lw is between 10 nm and 20 nm not inclusive is effective for reducing the dark current, increasing the maximum multiplication rate and improving the ionization factor ratio.

According to the present invention, a high-speed, high-sensitivity superlattice APD of 10 Gb/s is capable of being realized. In addition, a high gain, a high ionization rate ratio, a low dark current and a low noise are made possible.

What is claimed is:

1. A superlattice avalanche photodiode comprising:
   a first semiconductor layer having a first conductivity type;
   a superlattice multiplication layer disposed on said first semiconductor layer, said superlattice multiplication layer including a plurality of well layers and a plurality of barrier layers being arranged such that individual well layers are alternately disposed with individual barrier layers, a total thickness of said superlattice multiplication layer being 0.7 μm or less, and each of the well layers having a thickness less than 10 nm and each of the barrier layers having a thickness less than 20 nm;
   a second semiconductor layer disposed on said superlattice multiplication layer and having a second conductivity type; and
   a first electrode disposed on said first semiconductor layer and a second electrode disposed on said second semiconductor layer; and
   a light absorption layer disposed between said first semiconductor layer and said superlattice multiplication layer.

2. The superlattice avalanche photodiode according to claim 1, further comprising a field relaxation layer disposed between said light absorption layer and said superlattice multiplication layer.

3. The superlattice avalanche photodiode according to claim 1, further comprising a graded layer disposed between said light absorption layer and said superlattice multiplication layer.

4. A superlattice avalanche photodiode comprising:
   a first semiconductor layer having a first conductivity type;
   a superlattice multiplication layer disposed on said first semiconductor layer, said superlattice multiplication layer including a plurality of well layers and a plurality of barrier layers being arranged such that individual well layers are alternately disposed with individual barrier layers, a total thickness of said superlattice multiplication layer being 0.7 μm or less, and each of the well layers having a thickness less than 10 nm and each of the barrier layers having a thickness less than 20 nm;
   a second semiconductor layer disposed on said superlattice multiplication layer and having a second conductivity type; and
   a first electrode disposed on said first semiconductor layer and a second electrode disposed on said second semiconductor layer; and
   a light absorption layer disposed between said superlattice multiplication layer and said second semiconductor layer.

5. The superlattice avalanche photodiode according to claim 4, further comprising a field relaxation layer disposed between said light absorption layer and said superlattice multiplication layer.

6. The superlattice avalanche photodiode according to claim 4, further comprising a graded layer disposed between said light absorption layer and said superlattice multiplication layer.

7. The superlattice avalanche photodiode according to claim 1, wherein said superlattice multiplication layer further includes a plurality of graded layers, each graded layer disposed between one of said well layers and one of said barrier layers.

8. The avalanche photodiode according to claim 1, further comprising a polyimide isoindoloquinazolinedione layer in which said first and second semiconductor layers and said superlattice multiplication layer are embedded.

9. The superlattice avalanche photodiode according to claim 1, wherein the total thickness of the multiplication layer is 0.5 μm or less.

10. The superlattice avalanche photodiode according to claim 4, wherein said superlattice multiplication layer further includes a plurality of graded layers, each graded layer disposed between one of said well layers and one of said barrier layers.

11. The superlattice avalanche photodiode according to claim 4, further comprising a polyimide isoindoloquinazolinedione layer in which said first and second semiconductor layers are said superlattice multiplication layer are embedded.

12. The superlattice avalanche photodiode according to claim 4, wherein the total thickness of the multiplication layer is 0.5 μm or less.

13. The superlattice avalanche photodiode according to claim 1, wherein an electric field applied to the superlattice multiplication layer is higher than an electric field applied to any other portions of said superlattice avalanche photodiode.

14. The superlattice avalanche photodiode according to claim 4, wherein an electric field applied to the superlattice multiplication layer is higher than an electric field applied to any other portions of said superlattice avalanche photodiode.

15. The superlattice avalanche photodiode according to claim 1, wherein the total thickness of the superlattice multiplication layer is approximately 0.7 μm, the well layer thickness is approximately 5 nm, and the barrier layer thickness is approximately 6.6 nm.

16. The superlattice avalanche photodiode according to claim 4, wherein the total thickness of the superlattice multiplication layer is approximately 0.7 μm, the well layer thickness is approximately 5 nm, and the barrier layer thickness is approximately 6.6 nm.

17. The superlattice avalanche photodiode according to claim 1, wherein the thickness of the barrier layer is greater than 10 nm.

18. The superlattice avalanche photodiode according to claim 4, wherein the thickness of the barrier layer is greater than 10 nm.

19. The superlattice avalanche photodiode according to claim 1, wherein the thickness of the light absorption layer is 1.0 μm or less.

20. The superlattice avalanche photodiode according to claim 4, wherein the thickness of the light absorption layer is 1.0 μm or less.

21. The superlattice avalanche photodiode according to claim 1, wherein a number of heterointerfaces in the superlattice multiplication layer is at least 30.

22. The superlattice avalanche photodiode according to claim 4, wherein a number of heterointerfaces in the superlattice multiplication layer is at least 30.

23. The superlattice avalanche photodiode according to claim 1, wherein the light absorption layer and the superlattice multiplication layer are isolated from each other.

24. The superlattice avalanche photodiode according to claim 4, wherein the light absorption layer and the superlattice multiplication layer are isolated from each other.

* * * * *

UNITED STATES PATENT AND TRADEMARK OFFICE
CERTIFICATE OF CORRECTION

PATENT NO. : 5,543,629
DATED : 6 August 1996
INVENTOR(S) : Hitoshi NAKAMURA et al.

It is certified that error appears in the above-indentified patent and that said Letters Patent is hereby corrected as shown below:

| Column | Line | |
|---|---|---|
| 1 | 45 | Delete "the". |
| 2 | 56 | After "narrow," delete ".". |
| 3 | 38 | After "layer" insert --12--. |
| 6 | 25 | Change "P=2x10$^{19}$" to --P=2x10$^{19}$--. |
| 6 | 60 | Change "Lb=15nm" to --Lb=15nm--. |

Signed and Sealed this

Seventh Day of January, 1997

Attest:

BRUCE LEHMAN

*Attesting Officer*  *Commissioner of Patents and Trademarks*